US008625352B2

(12) United States Patent
Gillingham

(10) Patent No.: US 8,625,352 B2
(45) Date of Patent: Jan. 7, 2014

(54) METHOD AND APPARATUS FOR SHARING INTERNAL POWER SUPPLIES IN INTEGRATED CIRCUIT DEVICES

(75) Inventor: Peter B. Gillingham, Kanata (CA)

(73) Assignee: Mosaid Technologies Incorporated, Ottawa, Ontario (CA)

(*) Notice: Subject to any disclaimer, the term of this patent is extended or adjusted under 35 U.S.C. 154(b) by 282 days.

(21) Appl. No.: 13/099,791

(22) Filed: May 3, 2011

(65) Prior Publication Data

US 2012/0127798 A1 May 24, 2012

Related U.S. Application Data

(60) Provisional application No. 61/416,437, filed on Nov. 23, 2010.

(51) Int. Cl.
*G11C 11/34* (2006.01)

(52) U.S. Cl.
USPC .......................... 365/185.18; 365/51; 365/63

(58) Field of Classification Search
USPC ........................................ 365/185.18, 51, 63
See application file for complete search history.

(56) References Cited

U.S. PATENT DOCUMENTS 6,031,760 A * 2/2000 Sakui et al. .............. 365/185.21
7,154,790 B2 12/2006 Han et al.
7,549,097 B2 * 6/2009 Momohara ................... 714/724
7,590,023 B2 * 9/2009 Kim .............................. 365/226
8,400,781 B2 * 3/2013 Gillingham ................... 361/790
2011/0050320 A1 3/2011 Gillingham et al.

FOREIGN PATENT DOCUMENTS

CA 2675561 8/2008
EP 0498336 2/1992

OTHER PUBLICATIONS

"Low Power Double Data Rate 2 (LPDDR2)", JEDEC Standard, JESD209-2B, JEDEC Solid State Technology Association, 238 pages, Feb. 2010.

* cited by examiner

*Primary Examiner* — Son Dinh
(74) *Attorney, Agent, or Firm* — Harvey Auerback

(57) ABSTRACT

A method, system and apparatus for sharing internal power supplies in integrated circuit devices is described. A multiple device integrated circuit 200 including multiple integrated circuits 202-205 each having internal power supplies is contained in an enclosure 201. Integrated circuits 202-205 are described showing how to make external connection to internal power supplies. Connections 208-212 are provided to the internal power supplies of each of devices 202-205. Another embodiment 500 of the system provides for disablement of regulators in multiple integrated circuits 502, 503, and 504 by another integrated circuit 501 for power consumption reduction. The method FIG. 6 includes providing devices and connecting the internal power supplies together. An integrated circuit 501 with a power supply 400 adapted to the system and method with additional circuitry 308, 404 and 402 for disabling a regulator 306 is described.

34 Claims, 6 Drawing Sheets

METHOD AND APPARATUS FOR SHARING INTERNAL POWER SUPPLIES IN INTEGRATED CIRCUIT DEVICES

FIELD OF THE INVENTION

The present invention relates generally to integrated circuit devices and in particular to integrated circuit devices having internal power supplies.

BACKGROUND OF THE INVENTION

Integrated Circuit devices such as DRAM (Dynamic Random Access Memory) and Flash (electrically erasable/programmable non-volatile memory) typically require for operation a number of voltages for separate operations including storing, reading, and erasing data. These voltages are internally generated by using an externally supplied voltage source often referred to as $V_{dd}$.

A conventional DRAM device may have a $V_{pp}$ supply for providing a high voltage for driving a wordline above the $V_{dd}$ level stored in a memory cell, a $V_{dd}/2$ supply for driving the cell plate to a mid-rail potential, and a $V_{bb}$ supply for providing a negative back bias potential to the memory cell substrate.

A conventional NAND Flash device may have pump circuits for generating $V_{pass}$ for application to unselected wordlines in a selected block during page read operations, $V_{pgm}$ for applying to selected wordlines in page program operations, and $V_{ers}$ for applying to wordlines in a selected block during block erase operations.

These internal voltage supply circuits occupy significant chip area and increase the die size and cost, this is particularly the case if capacitive pump circuits are used which require large pump and reservoir capacitors. The voltage supply circuits may also limit performance. For example, in a NAND Flash device the $V_{pgm}$ voltage must be pulsed and applied repeatedly to a wordline in alternation with verify read operations. The time that it takes to charge the wordline adds overhead to each program/verify read cycle and can extend the program time parameter $t_{PROG}$ which is a critical factor in NAND Flash performance.

In some integrated circuit devices, for example LPDDR2 (Low-Power Double Data Rate 2) DRAM as described in JEDEC (Joint Electron Device Engineering Council) specification JESD209-2B, the number of banks that can be activated within a given time window depends of $t_{FAW}$ (Four bank Activate Window) which is specified as 50 ns for the higher speed grades. Although commands to activate all 8 banks could be issued to the device within this period of time, the $t_{FAW}$ restriction limits the current drive requirements on the internal $V_{pp}$ generator, and perhaps other internal voltage generators as well, by forcing the user to activate a maximum of four banks in the rolling $t_{FAW}$ window. This restriction allows a size of the $V_{pp}$ generator to be reduced from that required for unrestricted bank activation, thereby saving die area and cost.

When a number of memory devices are combined to provide a larger memory subsystem, they are often connected to a common shared bus. In this case there may not be sufficient command bandwidth to exercise all devices to their maximum capabilities. For example, in the case of eight LPDDR2 DRAM devices connected to a shared command bus operating at 400 MHz, it is impossible to issue four bank activate commands to each device within a 50 ns $t_{FAW}$ window. One command requires two edges of the clock or 2.5 ns. Therefore at least some of the devices will not be fully utilizing the capabilities of their internal $V_{pp}$ generators. It is not practical for DRAM manufacturers to offer different variants of memory products with a range of internal voltage generator drive capabilities and optimized die size. Memory product manufacturers rely on high volume of standardized product to drive costs down.

SUMMARY OF THE INVENTION

The invention provides a method and apparatus for connecting the internal voltages of multiple integrated circuits together. This allows shared use of otherwise idle resources resulting in greater capacity and reduced size. The invention is adaptable to single or multiple voltage sharing. The apparatus includes an integrated circuit with a connection to the internal power supply from the external environment. Additional embodiments provide access to several internal supplies. The method includes the process of making access available and connecting multiple integrated circuits internal voltages and control.

An additional embodiment allows one integrated circuit to control the internal power supply of another similar integrated circuit. This is illustrated by the ability to disable the regulator in the power supply of the controlled integrated circuit resulting in reduced power consumption and more efficient allocation of resources.

The system includes multiple integrated circuits connected together sharing power supplies.

BRIEF DESCRIPTION OF DRAWINGS

Further features and advantages of the present invention will become apparent from the following detailed description, taken in combination with the appended drawings, in which.

It will be noted that throughout the appended drawings, like features are identified by like reference numerals.

DESCRIPTION OF EMBODIMENTS

Memory die may be stacked and packaged together on a single substrate to achieve higher volumetric efficiency. Interconnection between memory devices in the package and terminals on the package may be accomplished with wire bonds or TSVs (Through Silicon Via). U.S. patent application Ser. No. 12/757,540, filed Apr. 9, 2010, describes chip selection and bus configurations for stacked memory devices. As with discrete packaged memory devices, multiple die within a MCP (Multi-Chip Package) enclosure are often connected to the same bus.

Figure 1:
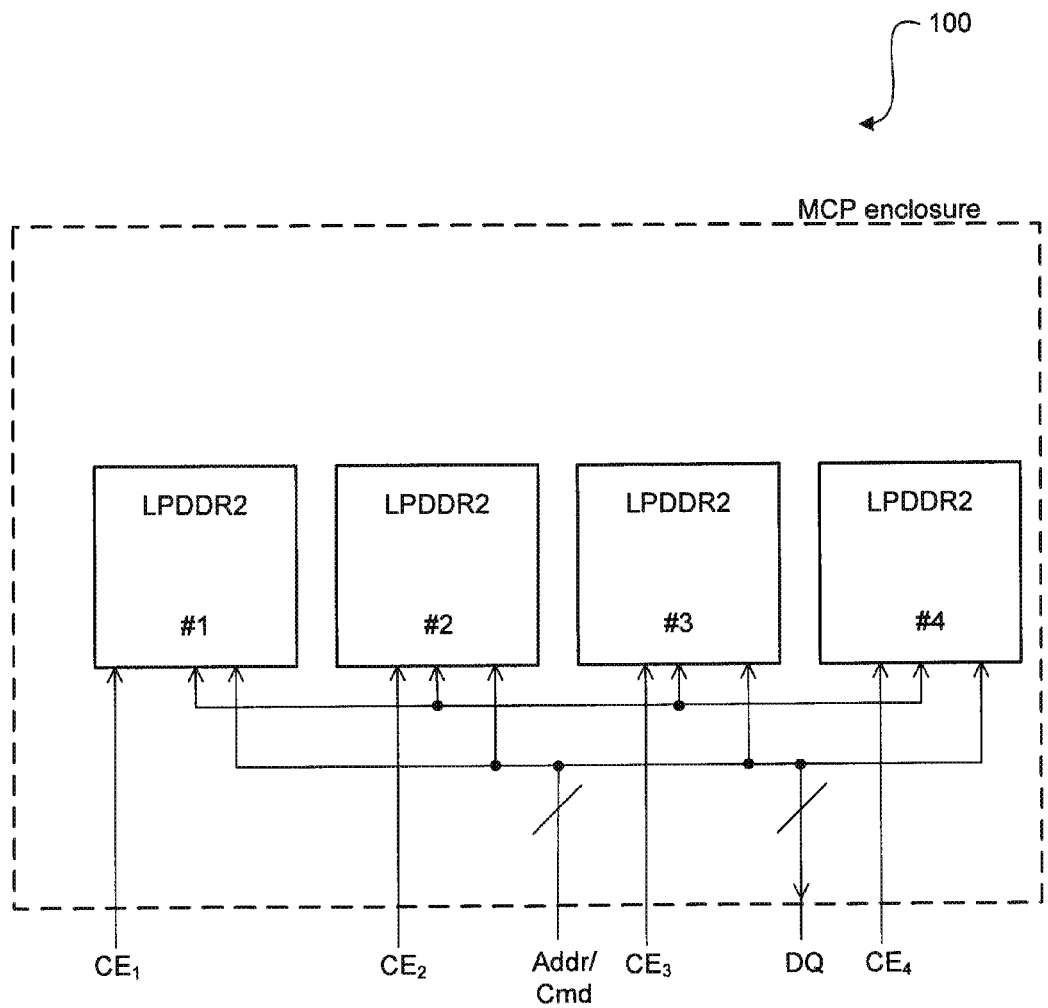
FIG. 1 is a block diagram of a conventional MCP (Multi-Chip Package) enclosure.

Referring to FIG. 1, in a conventional configuration, assume that 4 LPDDR DRAM die having the $t_{FAW}$ specification described hereinabove are packaged together in a single MCP 100.

Address and command inputs on all four die are wired together and connected to MCP address/command terminals. Likewise, bidirectional databus terminals (DQ) are connected in common to each die. Separate chip enable pins ($CE_1 \ldots CE_4$) allow commands to be directed towards individual LPDDR2 die within the MCP. Clocks are not specifically shown but are included as part of the address/command and data busses. Power supplies ($V_{dd}$, $V_{ss}$, $V_{ddq}$, and $V_{ssq}$) are also provided in common to all four die. This configuration shares the same drawbacks as a board level memory subsystem comprising discrete individually packaged memory devices. Bank activation in each die is limited by the $t_{FAW}$ specification and beyond a certain number of die there is insufficient command bandwidth to exercise each die to the $t_{FAW}$ limit.

Figure 2:
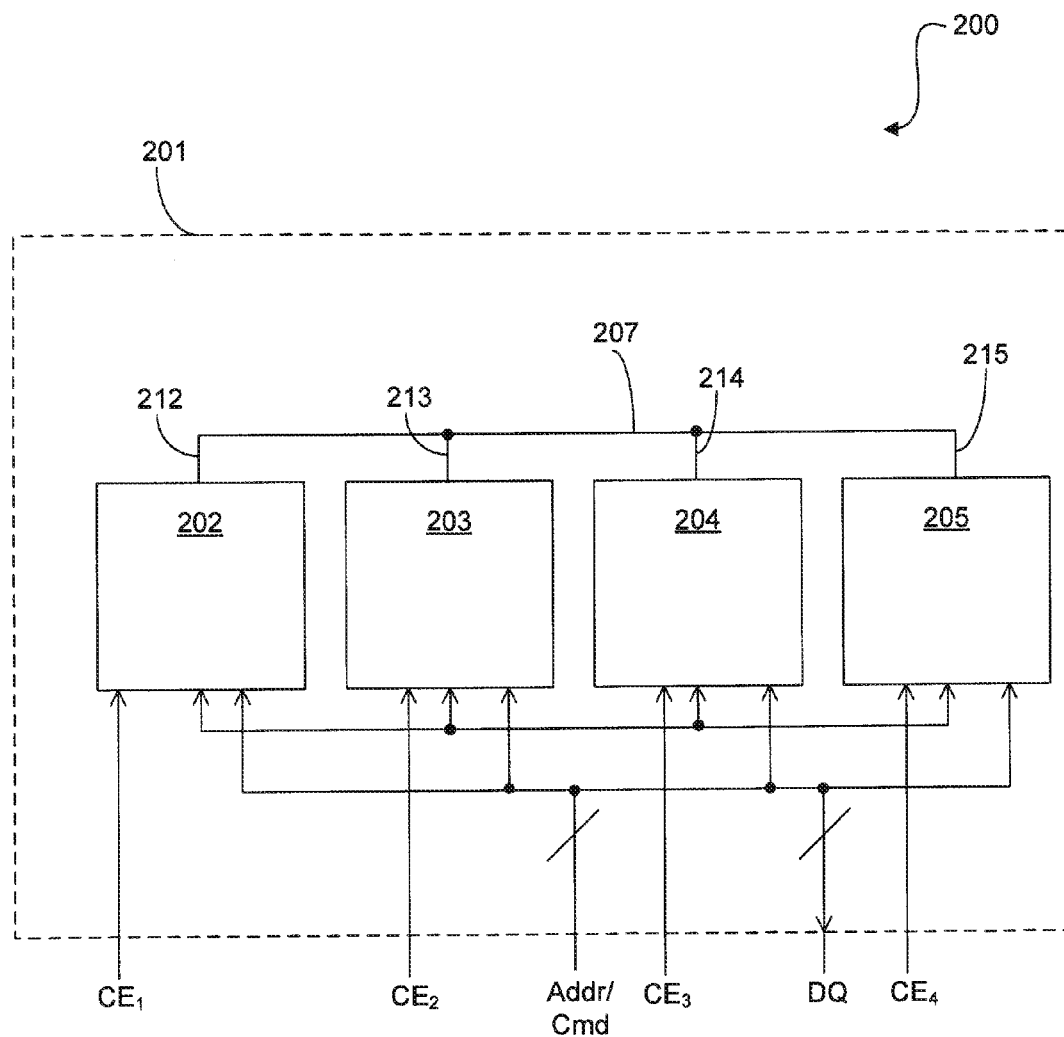
FIG. 2 is a block diagram of an MCP enclosure containing embodiments of the invention.

Referring to FIG. 2, in an embodiment of the invention 200 assume that 4 die having LPDDR2 functionality 202, 203, 204 and 205 all having the same $t_{FAW}$ specification as the conventional MCP 100 are packaged together in a single MCP 201. These die have been modified by the addition of a wire bond pad or TSV bump connection 212, 213, 214 and 215 respectively to the internal $V_{pp}$ voltage supply via a common bus 207. A second embodiment provides connections to other internal voltage supplies such as $V_{bb}$ or $V_{dd}/2$ in a similar manner. The result can be a reduction in the size of circuit components when all of die 202, 203, 204 and 205 power supplies are in parallel.

Within the MCP enclosure or encapsulation the internal $V_{pp}$ supply nodes 212, 213, 214 and 215 for each of the die 202, 203, 204 and 205 are wired together to bus 207. Assuming each of die 202, 203, 204 and 205 is capable of providing sufficient $V_{pp}$ current to activate 4 banks within a 50 ns $t_{FAW}$ window, the four die stack 200 can support 16 bank activations within the $t_{FAW}$ window, regardless of the distribution of the 16 banks among the four die. This can result in significant increases in performance without any additional die area penalty for larger internal supplies.

Figure 3:
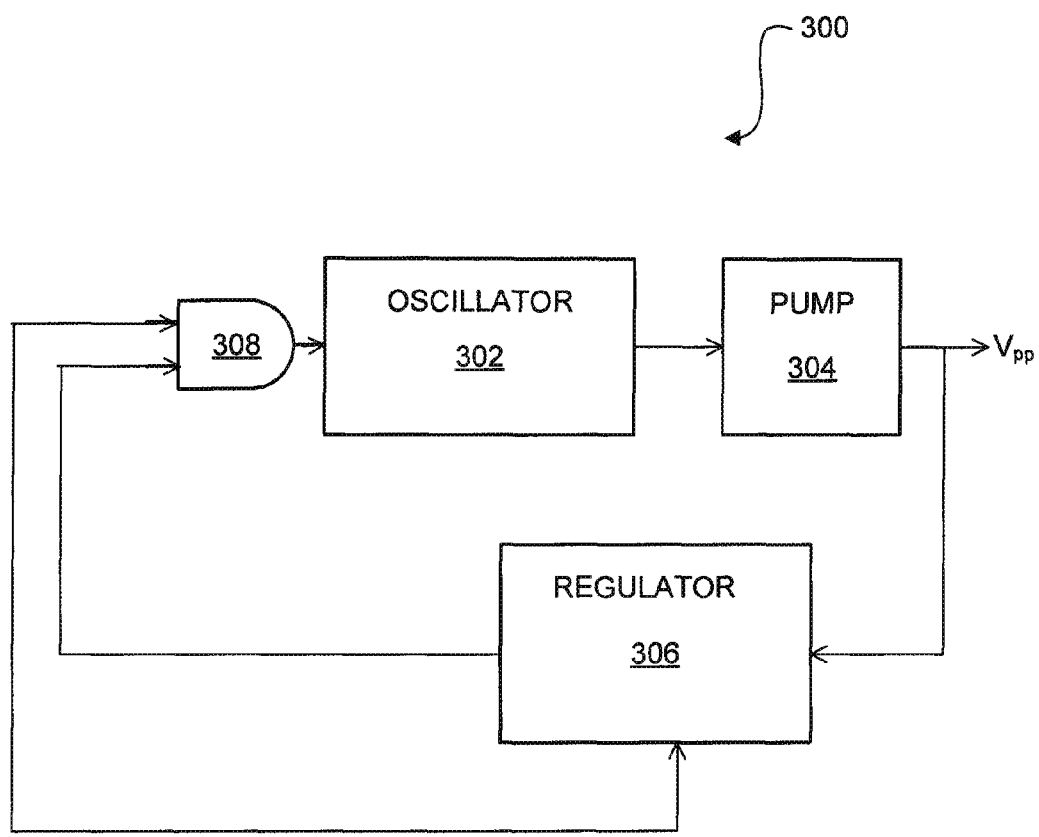
FIG. 3 is a block diagram of a conventional power supply.

FIG. 3 is a block diagram of a conventional $V_{pp}$ pump circuit 300. A capacitive pump circuit draws current from the $V_{dd}$ supply and boosts the level to a potential higher than $V_{dd}$. A simple form of the circuit can achieve a $V_{pp}$ level close to double that of $V_{dd}$. More complex circuits are known in the art for achieving voltage levels higher than $2 \times V_{dd}$. A $V_{bb}$ pump (not shown) has a similar structure.

An oscillator generates 302 a clock signal to control the capacitive pump 304. On each clock cycle, a quantity of charge is delivered to the output to increase the $V_{pp}$ level. Often, a reservoir capacitor is connected to the output for holding the charge and attenuating a voltage step caused by dumping charge on each clock cycle such capacitors can become quite large and occupy substantial space on the integrated circuit chip. A regulator 306 senses the level of $V_{pp}$ to determine when $V_{pp}$ has reached the desired level. When this occurs the regulator 306 output goes low to disable the oscillator 302 and pump 304. The $V_{pp}$ supply can be enabled or disabled with the EN input signal. In a deep power down mode when data in the memory does not have to be maintained the EN input signal can be brought low to disable the regulator 306 directly and turn off the oscillator 302 and pump 304 with an AND gate 308. In operation when the $V_{pp}$ level is below the desired level all three blocks 302, 304 and 306 consume power. When $V_{pp}$ reached the desired level only the regulator 306 consumes power. In the deep power down mode the regulator 306 is completely turned off by the EN input signal to save power.

In a third embodiment, a regulator in only one of the die is enabled while the remaining regulators are disabled. This can significantly reduce the power in self-refresh data retention mode which is particularly important in handheld portable devices such as cell phones.

Figure 4:
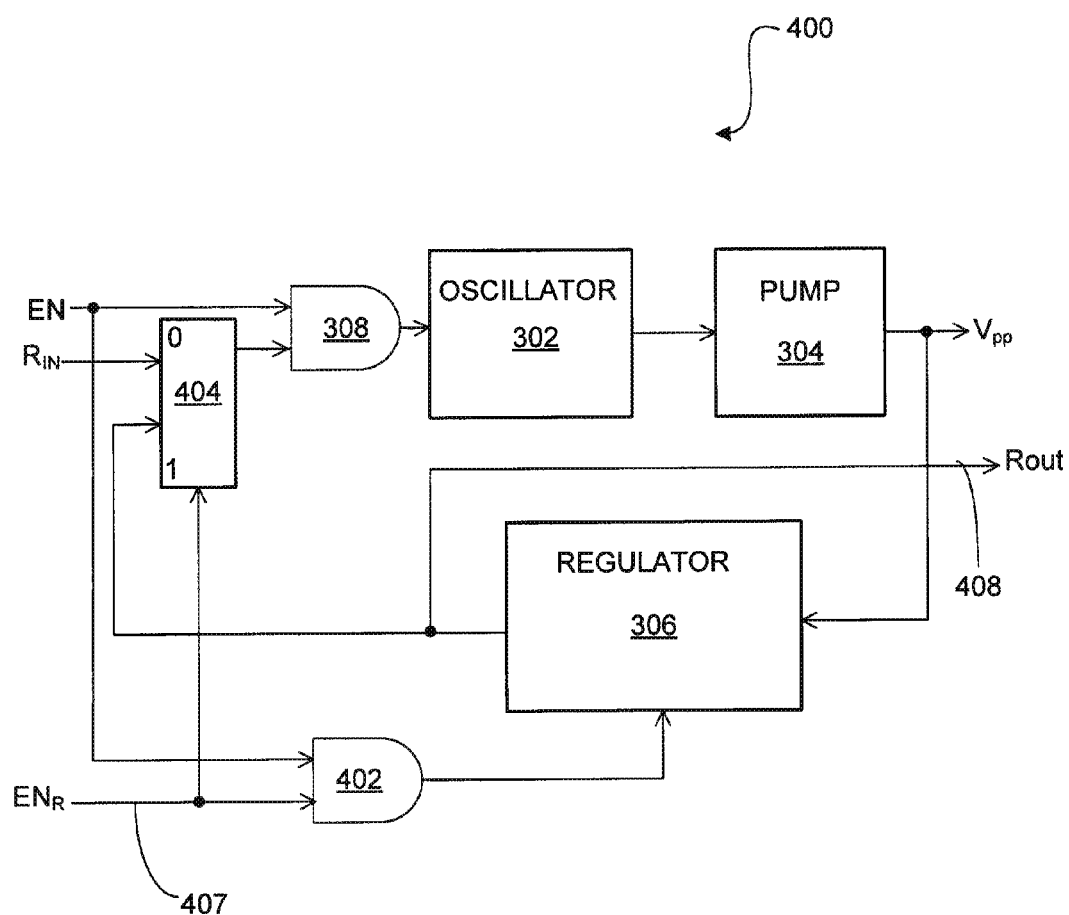
FIG. 4 is a block diagram of a switchable power supply suitable for a third embodiment of the invention.

FIG. 4 is a block diagram of a switchable power supply 400 suitable for the third embodiment of the invention. $V_{pp}$ supply 400 has an additional input $EN_R$ 407 to enable regulator 306. If $EN_R$ 407 is at a high level (1) the circuit functions identically to the FIG. 3 $V_{pp}$ supply. In this embodiment regulator 306 may be disabled by a low level signal (0) on $EN_R$ input 407. Input $EN_R$ 407 is connected to one input on AND gate 402 the result is disabling regulator 306 when the signal (0) is on $EN_R$. Additionally, externally provided regulator input $R_{IN}$ 406 is connected through a multiplexor 404 to control oscillator 302 and pump 304. $V_{pp}$ supply 400 also provides the local regulator output on the $R_{OUT}$ terminal 408.

Figure 5:
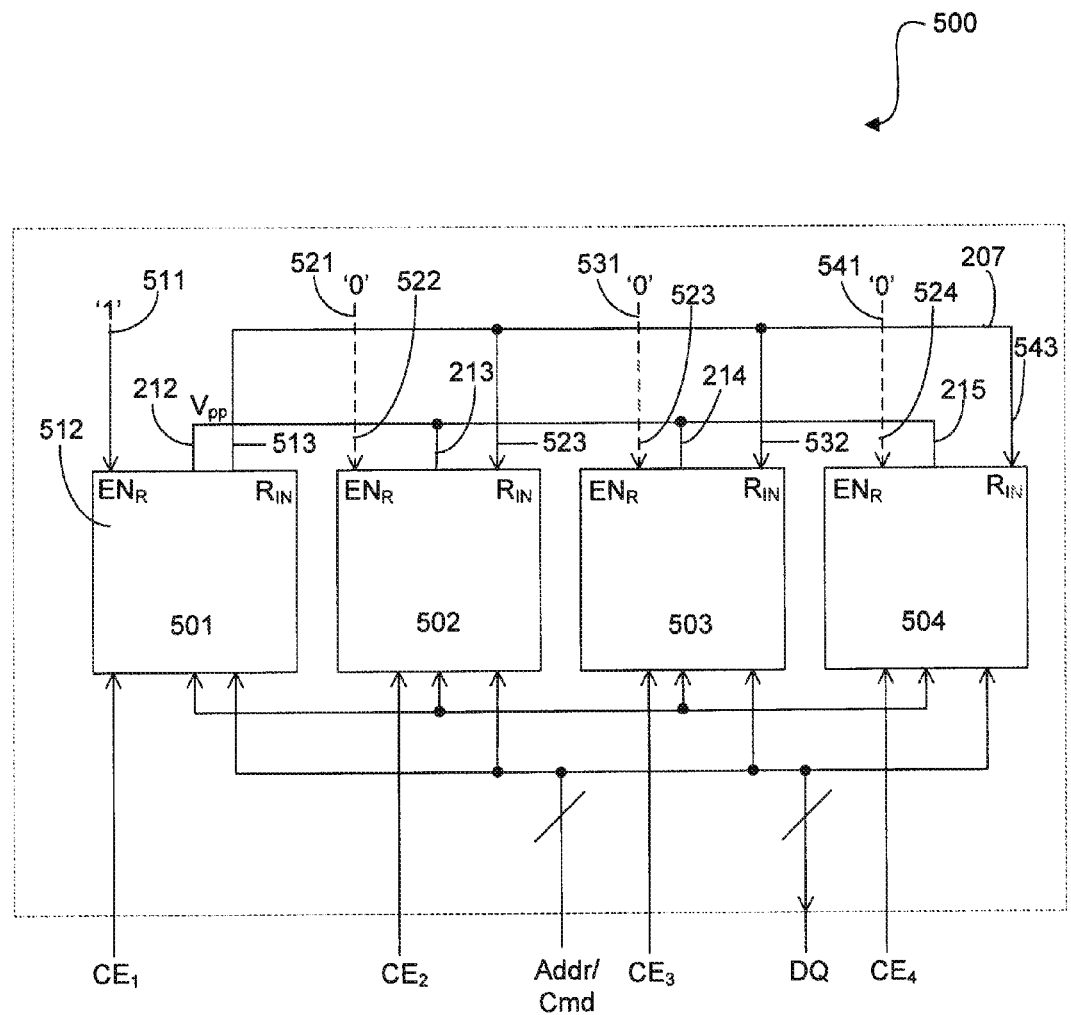
FIG. 5 is another block diagram of an MCP enclosure incorporating a third embodiment of the invention.

Referring to FIG. 5 a third embodiment of the invention incorporating the power supply of FIG. 4. As in FIG. 1 the internal $V_{pp}$ supply nodes 212, 213, 214 and 215 for each of the die 501, 502, 503 and 504 are wired together to bus 207 in a MCP 500. In this embodiment however, LPDDR2 die #1 501 has an enabled regulator so as a result of a logic high (1) 511 or $V_{dd}$ level applied to the $EN_R$ input 512, while LPDDR2 die #2 502, #3 503, and #4 504 have disabled regulators as a result of a logic low (0) on lines 521, 531 and 541 respectively or $V_{ss}$ level applied to the corresponding $EN_R$ inputs 522, 532 and 542. The regulator output $R_{OUT}$ 513 on die #1 is connected to the regulator inputs 523, 533 and 543 $R_{IN}$ on die #2 502, #3 503, and #4 504 respectively. As a result only one regulator (the one on LPDDR2 die #1 501) within MCP 500 is enabled and power consumption is reduced. As before, all $V_{pp}$ pumps on dies 501, 502, 503 and 504 can be activated when necessary to meet the current drive requirements on $V_{pp}$ as when multiple banks are activated within a short period of time. This technique can also be applied to other supplies in MCP DRAM such as the $V_{bb}$ substrate bias supply. It can also be applied to internal supplies on NAND Flash devices in MCP configurations such as $V_{prog}$ or $V_{ers}$ charge pumps.

Pumped supplies such as $V_{pp}$ can be ganged together without problem. In the case where each device has its own regulator enabled, due to variations from device to device each regulator may disable the pump at a slightly different voltage. Essentially the regulator with the highest threshold will determine the overall $V_{pp}$ of the combined system. Since the regulator in a $V_{pp}$ supply typically does not drain off excess charge to establish a voltage at exactly the threshold point, no power is wasted by having some variation in regulator threshold levels.

Figure 6:
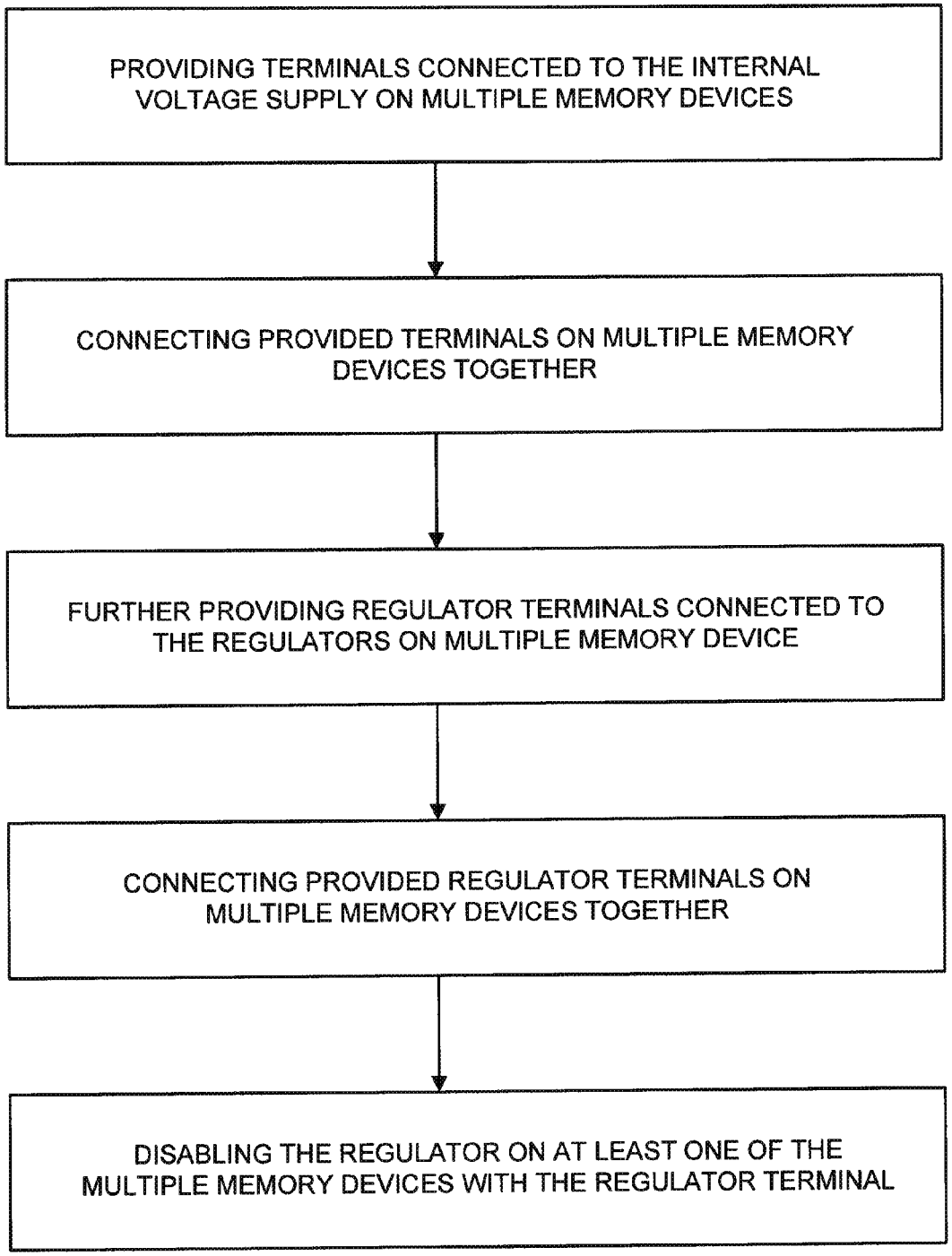
FIG. 6 is a flowchart of the method of the invention.

FIG. 6 is a flowchart of the method of the invention. As described above the first step is providing terminals on the individual memory devices connected to the internal power supply. In prior art devices these connections are inaccessible to other components. As described this method will work with such diverse devices as DRAM, flash memory including NAND flash, NOR flash, PCRAM (Phase Change Random Access Memory) and any memory element which includes an internal power supply.

The next step is connecting the terminals of the devices together allowing the devices to share power supplies. In the simplest embodiment as shown in FIG. 1 ends. The same process can be continued to connect other voltages internal to the memory devices such supplies in MCP DRAM such as the $V_{bb}$ substrate bias supply. It can also be applied to internal supplies on NAND Flash devices in MCP configurations such as $V_{prog}$ or $V_{ers}$ charge pumps.

The process continues in devices having internal regulators in their internal power supply. In such cases the devise can be provided with a regulator input and/or a regulator output connection. The regulator output connection of the first device is connected to the regulator input of at least one and frequently several devises. As described above this allow the first device to switch off and on the regulators of the other devices to save power and reduce heat buildup.

Although the figures show only sharing of $V_{pp}$ supply, any combination of internal supplies or all of the internal supplies can be shared within an MCP enclosure to improve performance, reduce power consumption, and optimize the die area within each individual die. These techniques can be applied to DRAM, flash memory including NAND flash and NOR flash, as well as other forms of memory such as PCRAM (Phase Change Random Access Memory) and other emerging memory technologies.

The invention claimed is:

1. A multichip package comprising:
    a plurality of memory dies,
    each memory die comprising an internal supply voltage generator connected to an internal supply voltage terminal, wherein said internal supply voltage terminals of each memory die are connected together within the multichip package.

2. The multichip package as in claim 1, wherein said memory dies are DRAM dies.

3. The multichip package as in claim 2, wherein said internal supply voltage generator is a wordline supply voltage generator.

4. The multichip package as in claim 2, wherein said internal supply voltage generator is a substrate bias supply voltage generator.

5. The multichip package as in claim 1, wherein said memory dies are flash memory dies.

6. The multichip package as in claim 5, wherein said flash dies are NAND flash dies.

7. The multichip package as in claim 6, wherein said internal supply voltage generator is a page program supply voltage generator.

8. The multichip package as in claim 6, wherein said internal supply voltage generator is a block erase supply voltage generator.

9. A multichip package comprising:
    a plurality of memory devices,
    each memory device further comprising an internal supply voltage generator connected to an internal supply voltage terminal, wherein said internal supply voltage terminals of each memory device are connected together within the multichip package,
    wherein said internal supply voltage generator further comprises:
    a regulator connected to a regulator output terminal, a regulator input terminal, and a regulator enable terminal, wherein said regulator enable terminal of said first memory device is connected within the multichip package to a first voltage for enabling said regulator in said first device, and said regulator enable terminal of a second memory device is connected within the multichip package to a second voltage for disabling said regulator in the second device.

10. The multichip package as in claim 9, wherein said regulator output terminal of the first memory device is connected to said regulator input terminal of a second memory device.

11. A method for constructing a multichip package comprising the steps of:
    providing a plurality of memory dies, each memory die having an internal supply voltage generator connected to an internal supply voltage terminal; and
    connecting the internal supply voltage terminals of each memory die together within the multichip package.

12. The method for constructing a multichip package as in claim 11, wherein said memory dies are DRAM dies.

13. The method for constructing a multichip package as in claim 12, wherein said internal supply voltage generator is a wordline supply voltage generator.

14. The method for constructing a multichip package as in claim 12, wherein said internal supply voltage generator is a substrate bias supply voltage generator.

15. The method for constructing a multichip package as in claim 11, wherein said memory dies are flash memory dies.

16. The method for constructing a multichip package as in claim 15, wherein said flash dies are NAND flash dies.

17. The method for constructing a multichip package as in claim 16, wherein said internal supply voltage generator is a page program supply voltage generator.

18. The method for constructing a multichip package as in claim 16, wherein said internal supply voltage generator is a block erase supply voltage generator.

19. A method for constructing a multichip package comprising the steps of:
    providing a plurality of memory devices, each memory device having an internal supply voltage generator connected to an internal supply voltage terminal; and
    connecting the internal supply voltage terminals of each memory device together within the multichip package,
    wherein said internal supply voltage generator further includes a regulator connected to a regulator output terminal, a regulator input terminal, and a regulator enable terminal, comprising the further step of connecting the regulator enable terminal of said first memory device within the multichip package to a first voltage for enabling said regulator in said first device, and connecting the regulator enable terminals of a second memory device within the multichip package to a second voltage for disabling the regulator in the second device.

20. The method for constructing a multichip package as in claim 19, comprising the further step of connecting the regulator output terminal of the first memory device to the regulator input terminal of the second memory device.

21. An integrated circuit die with an internal power supply adapted for sharing said internal power supply with at least one other integrated circuit die in a common package, the adaption comprising a first external connection to the internal power supply.

22. The integrated circuit die with an internal power supply as in claim 21, wherein said first external connection is selected from the group of wire bond pads and TSV bumps.

23. An integrated circuit device with an internal power supply adapted for sharing said internal power supply with at least one other integrated circuit device in a common package, the adaption comprising a first external connection to the internal power supply,
    further comprising a second connection to said internal power supply having a different potential than said first connection.

24. An integrated circuit device with an internal power supply adapted for sharing said internal power supply with at least one other integrated circuit device in a common package, the adaption comprising a first external connection to the internal power supply, further comprising:
    a regulator in said power supply; and
    a second connection to said internal power supply for disabling the regulator in another similar integrated circuit.

25. A system comprising:
    a plurality of memory dies in a multichip package, each memory die comprising an internal supply voltage generator connected to an internal supply voltage terminal, wherein said internal supply voltage terminals of each memory die are connected together within the multichip package.

26. The system as in claim 23, wherein said memory dies are DRAM dies.

27. The system as in claim 24, wherein said internal supply voltage generator is a wordline supply voltage generator.

28. The system as in claim 24, wherein said internal supply voltage generator is a substrate bias supply voltage generator.

29. The system as in claim 24, wherein said memory dies are flash memory dies.

30. The system as in claim 27, wherein said flash dies are NAND flash dies.

31. The system as in claim 28, wherein said internal supply voltage generator is a page program supply voltage generator.

32. The system as in claim 28, wherein said internal supply voltage generator is a block erase supply voltage generator.

33. A system comprising:
a plurality of memory devices in a multichip package, each memory device further comprising an internal supply voltage generator connected to an internal supply voltage terminal, wherein said internal supply voltage terminals of each memory device are connected together within the multichip package;
wherein said internal supply voltage generator further comprises:
a regulator connected to a regulator output terminal, a regulator input terminal, and a regulator enable terminal, wherein said regulator enable terminal of said first memory device is connected within the multichip package to a first voltage for enabling said regulator in said first device, and said regulator enable terminal of a second memory device is connected within the multichip package to a second voltage for disabling said regulator in the second device.

34. The system as in claim 33, wherein said regulator output terminal of the first memory device is connected to said regulator input terminal of the second memory device.

* * * * *

UNITED STATES PATENT AND TRADEMARK OFFICE
CERTIFICATE OF CORRECTION

| | | |
|---|---|---|
| PATENT NO. | : 8,625,352 B2 | Page 1 of 1 |
| APPLICATION NO. | : 13/099791 | |
| DATED | : January 7, 2014 | |
| INVENTOR(S) | : Gillingham | |

It is certified that error appears in the above-identified patent and that said Letters Patent is hereby corrected as shown below:

In the Claims:

Column 7, lines 4-17,

We ask that claims 26-32 be amended. The claim dependencies are incorrect. The claims should be amended as follows:

26. The system as in claim "23" --25--, wherein said memory dies are DRAM dies.

27. The system as in claim "24" --26--, wherein said internal supply voltage generator is a wordline supply voltage generator.

28. The system as in claim "24" --26--, wherein said internal supply voltage generator is a substrate bias supply voltage generator.

29. The system as in claim "24" --26--, wherein said memory dies are flash memory dies.

30. The system as in claim "27" --29--, wherein said flash dies are NAND flash dies.

31. The system as in claim "28" --30--, wherein said internal supply voltage generator is a page program supply voltage generator.

32. The system as in claim "28" --30--, wherein said internal supply voltage generator is a block erase supply voltage generator.

Signed and Sealed this
Seventh Day of October, 2014

Michelle K. Lee
*Deputy Director of the United States Patent and Trademark Office*